United States Patent
Umeda

(10) Patent No.: US 10,067,209 B2
(45) Date of Patent: Sep. 4, 2018

(54) MAGNETIC RESONANCE IMAGING APPARATUS

(71) Applicant: Masaaki Umeda, Sakura, Tochigi (JP)

(72) Inventor: Masaaki Umeda, Sakura, Tochigi (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 1098 days.

(21) Appl. No.: 13/740,453

(22) Filed: Jan. 14, 2013

(65) Prior Publication Data

US 2013/0181714 A1 Jul. 18, 2013

(30) Foreign Application Priority Data

Jan. 13, 2012 (JP) .................................. 2012-005519
Dec. 10, 2012 (JP) .................................. 2012-269515

(51) Int. Cl.
*G01R 33/54* (2006.01)
*G01R 33/561* (2006.01)
*G01R 33/565* (2006.01)

(52) U.S. Cl.
CPC ....... *G01R 33/543* (2013.01); *G01R 33/5617* (2013.01); *G01R 33/56518* (2013.01)

(58) Field of Classification Search
CPC G01R 33/5617; G01R 33/561; G01R 33/565; G01R 33/543; G01R 33/56518
USPC .......................... 324/307, 309, 314, 318, 322
See application file for complete search history.

(56) References Cited

U.S. PATENT DOCUMENTS

| | | | | |
|---|---|---|---|---|
| 5,455,512 | A | * | 10/1995 | Groen ............... G01R 33/56518 324/309 |
| 5,508,612 | A | | 4/1996 | Kanazawa |
| 5,570,019 | A | * | 10/1996 | Moonen ............ G01R 33/4833 324/307 |
| 5,942,897 | A | * | 8/1999 | Kanazawa ....... G01R 33/56518 324/307 |
| 6,078,176 | A | * | 6/2000 | McKinnon ....... G01R 33/56341 324/307 |
| 6,369,568 | B1 | | 4/2002 | Ma et al. |

(Continued)

FOREIGN PATENT DOCUMENTS

| CN | 101564298 A | 10/2009 |
|---|---|---|
| JP | 3-31451 | 5/1991 |

(Continued)

OTHER PUBLICATIONS

Günther, M. and Feinberg, D. A. (2005), Simultaneous spin-echo refocusing. Magn Reson Med, 54: 513-523. doi: 10.1002/mrm.20587.*

(Continued)

*Primary Examiner* — Rishi Patel
(74) *Attorney, Agent, or Firm* — Nixon & Vanderhye P.C.

(57) ABSTRACT

A magnetic resonance imaging apparatus according to an embodiment includes a controller and an image reconstruction unit. The controller executes a pulse sequence having spare time during the time after transient of a gradient magnetic field for dephasing, applied in a readout direction after a radio frequency (RF) pulse for excitation is applied, until the first RF pulse for refocusing is applied in the case where imaging based on a fast spin echo method is performed. The image reconstruction unit reconstructs an image from magnetic resonance data collected by executing the pulse sequence.

9 Claims, 10 Drawing Sheets

(56) References Cited

U.S. PATENT DOCUMENTS

| | | | |
|---|---|---|---|
| 8,093,895 B2 | 1/2012 | Umeda | |
| 8,228,060 B2* | 7/2012 | Busse | A61B 5/055 |
| | | | 324/307 |
| 8,570,036 B2 | 10/2013 | Miyoshi | |
| 2003/0011367 A1* | 1/2003 | Asano | G01R 33/5615 |
| | | | 324/309 |
| 2004/0155655 A1* | 8/2004 | Uetake | G01R 33/56518 |
| | | | 324/314 |
| 2009/0091324 A1* | 4/2009 | Sugiura | G01R 33/4828 |
| | | | 324/309 |
| 2009/0212772 A1* | 8/2009 | Ookawa | G01R 33/5615 |
| | | | 324/309 |
| 2010/0188085 A1* | 7/2010 | Huo | G01R 33/4824 |
| | | | 324/309 |
| 2010/0259260 A1* | 10/2010 | Lee | G01R 33/446 |
| | | | 324/309 |
| 2011/0245655 A1 | 10/2011 | Abe et al. | |
| 2011/0291651 A1* | 12/2011 | Umeda | G01R 33/56554 |
| | | | 324/307 |
| 2011/0291653 A1* | 12/2011 | Umeda | G01R 33/56554 |
| | | | 324/309 |

FOREIGN PATENT DOCUMENTS

| | | |
|---|---|---|
| JP | H07-155309 A | 6/1995 |
| JP | 2004-236848 A | 8/2004 |
| JP | 2011-025009 A | 2/2011 |

OTHER PUBLICATIONS

Himmelreich et al. "MRI for Dummies", YBMRS 2011. pp. 1-11.*
Office Action dated Aug. 5, 2014, in CN 201310011485.X.
Office Action dated Aug. 2, 2016 in JP Patent Application No. 2012-269515.

* cited by examiner

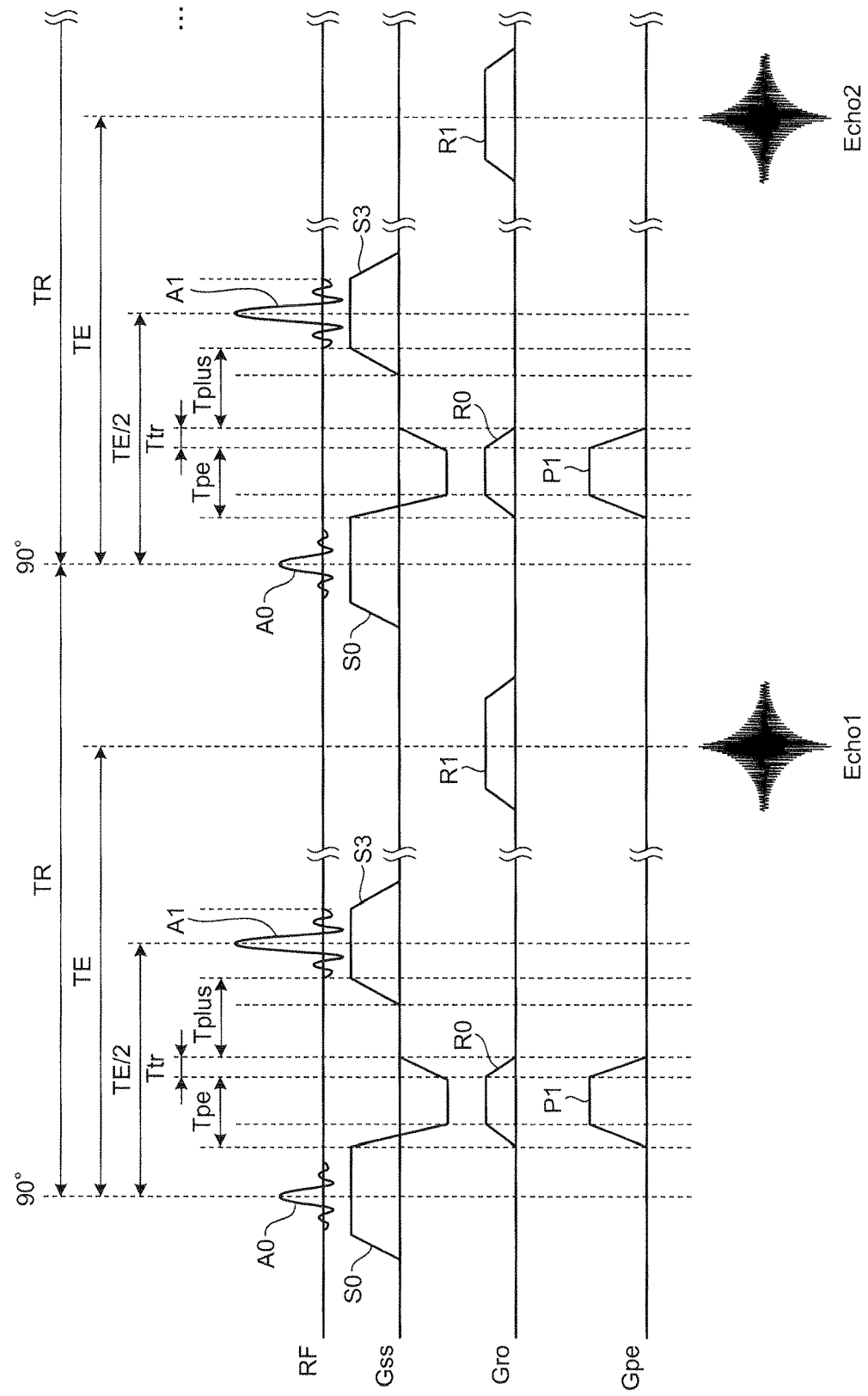

MAGNETIC RESONANCE IMAGING APPARATUS

CROSS-REFERENCE TO RELATED APPLICATIONS

This application is based upon and claims the benefit of priority from Japanese Patent Application No. 2012-005519, filed on Jan. 13, 2012; and Japanese Patent Application No. 2012-269515, filed on Dec. 10, 2012, the entire contents of all of which are incorporated herein by reference.

FIELD

Embodiments described herein relate generally to a magnetic resonance imaging (MRI) apparatus.

BACKGROUND

As an imaging method relating to a magnetic resonance imaging apparatus, a fast spin echo (FSE) method has been used in related art. The FSE method is an imaging method in which a radio frequency (RF) pulse for excitation is applied to a subject and thereafter a plurality of RF pulses for refocusing are sequentially applied thereto so as to collect a plurality of echo signals called echo train. In the imaging based on the FSE method, it is known that image quality is deteriorated since echo peaks or phases of a spin echo signal and a stimulated echo signal are shifted due to an eddy field.

BRIEF DESCRIPTION OF THE DRAWINGS

FIG. 11 is a chart illustrating an example of a pulse sequence of an SE method according to a third embodiment.

DETAILED DESCRIPTION

A magnetic resonance imaging apparatus according to embodiments includes a controller and an image reconstruction unit. The controller is configured to execute a pulse sequence having spare time during the time after transient a gradient magnetic field for dephasing, applied in the readout direction after a radio frequency (RF) pulse for excitation is applied, until a first RF pulse for refocusing is applied in the case where imaging based on a fast spin echo method is performed. The image reconstruction unit is configured to reconstruct an image from magnetic resonance data collected by executing the pulse sequence.

Hereinafter, a magnetic resonance imaging (MRI) apparatus according to some embodiments will be described in detail with reference to the drawings. The magnetic resonance imaging apparatus will be called an MRI apparatus in the embodiments described below.

First Embodiment

Figure 1:
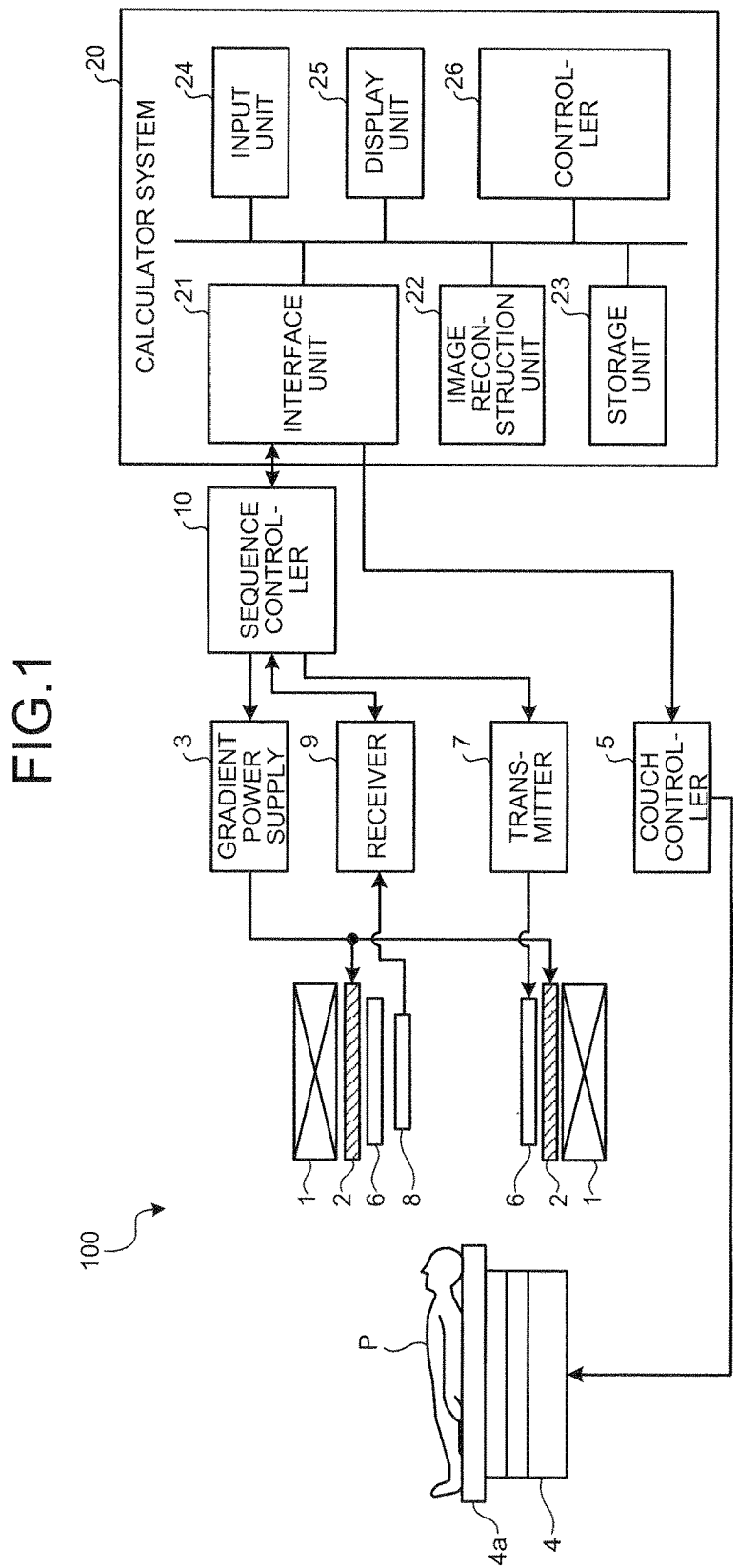
FIG. 1 is a diagram illustrating a configuration of an MRI apparatus according to a first embodiment.

FIG. 1 is a diagram illustrating a configuration of an MRI apparatus according to a first embodiment. As illustrated in FIG. 1, an MRI apparatus 100 includes a static magnetic field magnet 1, a gradient coil 2, a gradient power supply 3, a couch 4, a couch controller 5, a transmission RF coil 6, a transmitter 7, a reception RF coil 8, a receiver 9, a sequence controller 10, and a calculator system 20.

The static magnetic field magnet 1 is a magnet formed in a hollow cylindrical shape and generates a uniform static magnetic field in the internal space thereof. As the static magnetic field magnet 1, for example, a permanent magnet, a superconducting magnet or the like is used.

The gradient coil 2 is a coil formed in a hollow cylindrical shape and arranged inside the static magnetic field magnet 1. The gradient coil 2 is formed by combining three coils corresponding to each of the mutually orthogonal axes X, Y, and Z. These three coils are individually supplied with electrical current from the gradient power supply 3 to be described later and generate a gradient magnetic field in which magnetic field strength varies along the respective axes X, Y, and Z. The Z-axis direction is taken to be along the static magnetic field. The gradient power supply 3 supplies electrical current to the gradient coil 2.

The gradient magnetic fields of the axes X, Y, and Z generated by the gradient coil 2 correspond to, for example, a gradient magnetic field for slice selection Gss, a gradient magnetic field for phase encoding Gpe, and a gradient magnetic field for readout Gro, respectively. The gradient magnetic field for slice selection Gss is used for optionally determining an imaging cross section. The gradient magnetic field for phase encoding Gpe is used for changing the phase of a magnetic resonance signal according to a spatial location thereof. The gradient magnetic field for readout Gro is used for changing the frequency of the magnetic resonance signal according to the spatial location thereof.

The couch 4 includes a couchtop 4a on which a subject P is placed. The couchtop 4a is inserted into the cavity (a port for imaging) of the gradient coil 2 in a state where the subject P is placed under the control of the couch controller 5 to be described later. Generally, the couch 4 is installed such that the longitudinal direction thereof is parallel to the central axis of the static magnetic field magnet 1. The couch controller 5 is a device for controlling the couch 4 under the control of the calculator system 20, and drives the couch 4 to move the couchtop 4a in the longitudinal direction and the vertical direction.

The transmission RF coil 6 is arranged inside the gradient coil 2 and generates a radio frequency (RF) pulse (high frequency magnetic field pulse) by high-frequency pulse current supplied from the transmitter 7. The transmitter 7 supplies high-frequency pulse current corresponding to a Larmor frequency to the transmission RF coil 6. The reception RF coil 8 is arranged inside the gradient coil 2 and receives a magnetic resonance signal radiated from the subject P due to an influence of the RF pulse. Upon receiving the magnetic resonance signal, the reception RF coil 8 outputs the magnetic resonance signal to the receiver 9.

The receiver 9 generates magnetic resonance (MR) signal data on the basis of the magnetic resonance signal output from the reception RF coil 8. The receiver 9 generates the MR signal data through digital conversion of the magnetic resonance signal output from the reception RF coil 8. The MR signal data is then associated to pieces of information about spatial frequencies in the phase encoding direction, the readout direction, and the slice encoding direction and arranged in the k-space by the above-described gradient magnetic field for slice selection Gss, gradient magnetic field for phase encoding Gpe, and gradient magnetic field for readout Gro. Once generating the MR signal data, the receiver 9 transmits the MR signal data to the sequence controller 10.

The sequence controller 10 executes scanning of the subject P by driving the gradient power supply 3, the transmitter 7, and the receiver 9 on the basis of sequence execution data transmitted from the calculator system 20. The sequence execution data described herein means information that defines a pulse sequence indicating procedures to execute scanning of the subject P, such as strength and a timing of the power supplied from the gradient power supply 3 to the gradient coil 2, strength and a timing of the RF signal transmitted from the transmitter 7 to the transmission RF coil 6, and a timing at which the receiver 9 detects the magnetic resonance signal. The sequence controller 10 drives the gradient power supply 3, the transmitter 7, and the receiver 9 on the basis of the sequence execution data. Thereafter, when the MR signal data is transmitted from the receiver 9, the sequence controller 10 transfers the MR signal data to the calculator system 20.

The calculator system 20 integrally controls the MRI apparatus 100. For example, the calculator system 20 performs scanning of the subject P or image reconstruction by driving each of the components included in the MRI apparatus 100. The calculator system 20 includes an interface unit 21, an image reconstruction unit 22, a storage unit 23, an input unit 24, a display unit 25, and a controller 26.

The interface unit 21 controls input/output of various signals to/from the sequence controller 10. For example, the interface unit 21 transmits sequence execution data to the sequence controller 10 and receives MR signal data from the sequence controller 10. Upon receiving the MR signal data, the interface unit 21 stores each piece of the MR signal data in the storage unit 23 per each subject P.

The image reconstruction unit 22 generates spectrum data or image data of a desired nuclear spin inside the subject P by performing post-processing, that is, reconstruction processing such as Fourier transform on the MR signal data stored in the storage unit 23.

The storage unit 23 stores therein various data and computer programs required for the processes executed by the controller 26 to be described later. For example, the storage unit 23 stores therein the MR signal data received by the interface unit 21, the spectrum data or image data generated by the image reconstruction unit 22 and the like per each subject P. For example, the storage unit 23 is a storage device such as a semiconductor memory element including a random access memory (RAM), a read only memory (ROM), and a flash memory, a hard disc, or an optical disc.

The input unit 24 receives various instructions or information input from an operator. As the input unit 24, a pointing device such as a mouse or a trackball, a selection device such as a mode switch, or an input device such as a keyboard may be appropriately used.

The display unit 25 displays various information such as spectrum data or image data under the control of the controller 26. As the display unit 25, a display device such as a liquid crystal display may be used.

The controller 26 includes a central processing unit (CPU), a memory, and the like (not illustrated) and integrally controls the MRI apparatus 100. For example, the controller 26 controls the scanning by generating various sequence execution data on the basis of an imaging condition input by the operator through the input unit 24, and transmitting the generated sequence execution data to the sequence controller 10. Furthermore, the controller 26 controls the image reconstruction unit 22 so as to reconstruct the image on the basis of the MR signal data when the MR signal data is transmitted from the sequence controller 10 as a result of the scanning.

The configuration of the MRI apparatus 100 according to the first embodiment has been described hereinabove. In the MRI apparatus 100 having such a configuration, when imaging based on the spin echo-based imaging method is performed, the controller 26 executes a pulse sequence having spare time obtained from a short time constant of an eddy field that cannot be sufficiently compensated by hardware of the apparatus during the time after transient of a gradient magnetic field for dephasing until the first RE pulse for refocusing is applied. For example, when the imaging based on the spin echo-based imaging method is performed, the controller 26 executes a pulse sequence in which the time from application of an RE pulse for excitation to application of the first RE pulse for refocusing is extended by a predetermined extension time. Then the image reconstruction unit 22 reconstructs the image from the magnetic resonance data collected by executing the pulse sequence. In this embodiment, the case where the gradient magnetic field for dephasing is applied in the readout direction is described. However, the same applies to the case where the gradient magnetic field for dephasing is applied in the slice selection direction by providing spare time during the time after the transient of the gradient magnetic field for dephasing until the first RF pulse for refocusing is applied.

In the first embodiment, an example in which imaging is performed based on a fast spin echo (ESE) method will be described. Generally, in the FSE method, imaging is performed by making coherent the echo peaks and phases of the spin echo signal and the stimulated echo signal. It is known that image quality deterioration (such as uneven sensitivity, signal degradation, and ghost) occurs due to the shift of the echo peaks or phases of these signals. To prevent the image quality deterioration, a method for performing pre-scan to adjust the RF pulse or the gradient magnetic field has been widely used in the related art.

In addition, a variable flip angle (VEA) method, which changes a flip angle of the RF pulse for refocusing per each echo in the pulse sequence of the FSE method, has been developed in recent years. Since many echo signals are collected in one shot (1 TR (repetition time)) in the VFA method, an echo space (hereinafter referred to as ETS) is preferably shortened in order to obtain an image with less blur. However, if the ETS is shortened (for example, 5 ms or less), image quality deterioration may occur even in the pre-scanning method when an eddy component with a very short time constant (eddy component with a time constant of about several hundreds of μs) is generated or when the time constant behaves as short swirl because the gradient magnetic field does not ideally rise.

Figure 2:
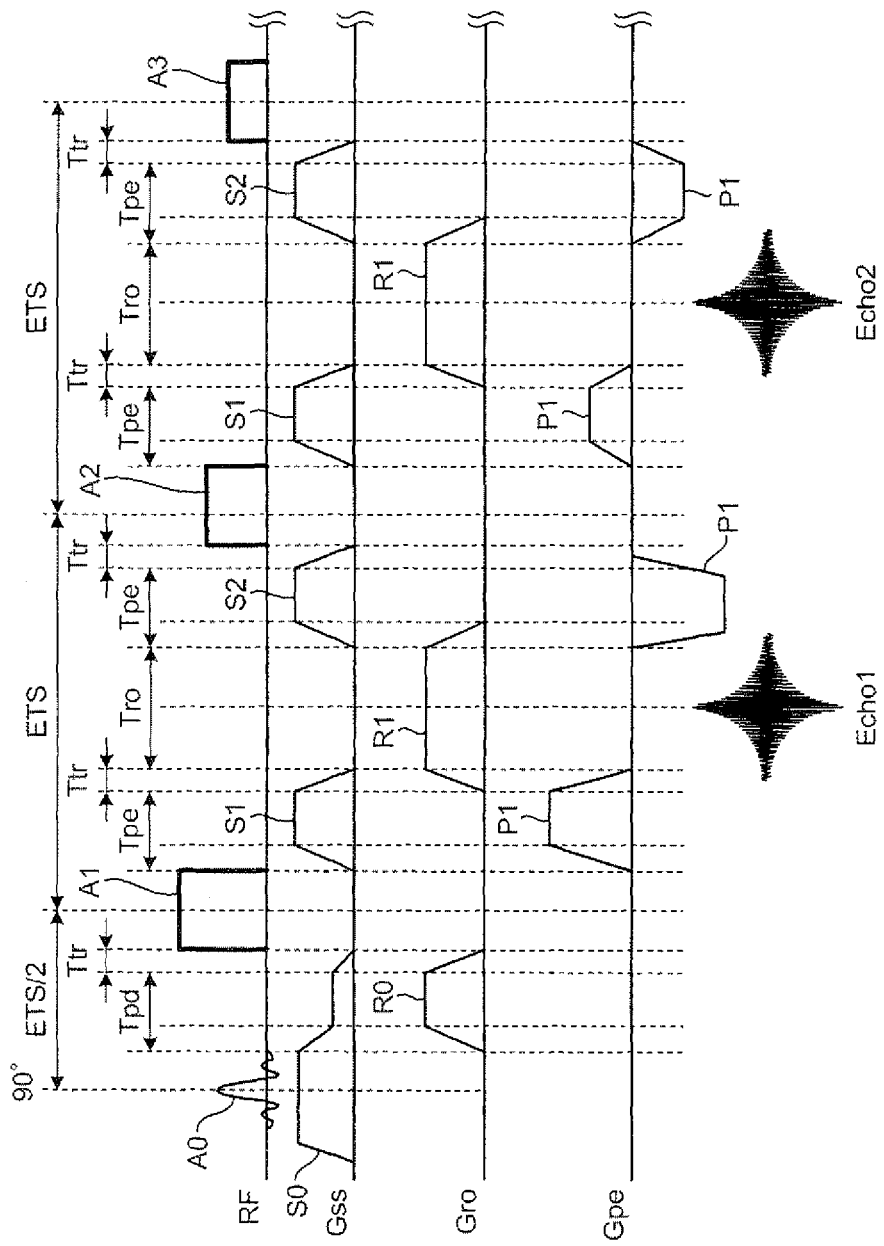
FIG. 2 is a chart illustrating an example of a pulse sequence of an FSE method in the related art.

FIG. 2 is a chart illustrating an example of a pulse sequence of the FSE method in the related art. The example illustrated in FIG. 2 is an example of a pulse sequence using the VFA method, and an example in the case where a slice selection in each of the refocusing pulses is non-selective. In FIG. 2, the horizontal axis indicates time, and "RF" indicates an application timing of the RF pulse for excitation (hereinafter referred to as an excitation pulse) and the RF pulse for refocusing (hereinafter referred to as a refocusing pulse). In addition, "Gss" indicates an application timing and strength of the gradient magnetic field for slice selection, "Gpe" indicates an application timing and strength of the gradient magnetic field for phase encoding, and "Gro" indicates an application timing and strength of the gradient magnetic field for readout.

As illustrated in FIG. 2, in the FSE method, a plurality of refocusing pulses A1, A2, and A3 are sequentially applied after the excitation pulse A0 (90° pulse) is applied. Since the example illustrated in FIG. 2 is a VFA pulse sequence, flip angles are different for each of the refocusing pulses. Although FIG. 2 illustrates first to third refocusing pulses for simplicity, in fact, a plurality of refocusing pulses are continuously applied.

A gradient magnetic field for slice selection S0 is applied in the slice selection direction when the excitation pulse A0 is applied. After each of the refocusing pulses is applied, a gradient magnetic field for spoiler S1 for silencing FID signals generated by the refocusing pulses is applied. Before each of the refocusing pulses is applied, a gradient magnetic field for rewinding S2 for cancelling a phase shift in the slice selection direction is applied. Since the example illustrated in FIG. 2 is an example in the case where a slice selection in each of the refocusing pulses is non-selective, the gradient magnetic field for slice selection is not applied when the refocusing pulses are applied.

A gradient magnetic field for dephasing R0 is applied in the readout direction after the excitation pulse A0 is applied. In addition, gradient magnetic fields for readout R1 are applied at a timing when the echo signals are generated. Gradient magnetic fields for phase encoding P1 are applied in the phase encoding direction after the refocusing pulses are applied. The gradient magnetic fields for phase encoding vary in strength for each of the refocusing pulses so that the phase encoding amount varies for each of the echo signals.

In FIG. 2, Tpd indicates application time of the gradient magnetic field for dephasing, Ttr indicates transient time of the gradient magnetic fields. In addition, Tpe indicates application time of the gradient magnetic field for phase encoding, and Tro indicates application time of the gradient magnetic field for readout. The time from the excitation pulse AO to the first refocusing pulse A1 is half of the ETS, and the refocusing pulses are applied at intervals of the ETS for the second refocusing pulse A2 and the subsequent pulses. As a result, a plurality of echo signals Echo1, Echo2, are collected at intervals of the ETS for each of the refocusing pulses.

In the case where imaging based on the FSE method is performed by using the pulse sequence, shift in echo peaks (in the image space, first-order phase shift in the readout direction) is measured through pre-scan before the scanning. An area of the gradient magnetic field for dephasing R0 is adjusted on the basis of the shift amount measured during pre-scanning, so that image quality deterioration due to an influence of the eddy field is suppressed.

However, as described above, it is preferable to shorten the ETS so as to obtain an image with less blur in the VFA method. To achieve this, the application time of the refocusing pulse, Tpd, Ttr, and the like should all be shortened. On the other hand, if the ETS is shortened, although image quality deterioration hardly occurs to an eddy component with a long time constant (several tens of ms to several hundreds of ms), image quality deterioration easily occurs when an eddy component with a very short time constant (several hundreds of µs) exists or when the time constant behaves as short swirl because the gradient magnetic field does not ideally rise.

Since the eddy component with a short time constant does not exhibit a simple first-order phase shift in the image space, image quality deterioration (in particular, in-plane uneven sensitivity in the readout direction) cannot be sufficiently prevented only by adjusting the area of the gradient magnetic field for dephasing in some cases. For example, image quality deterioration can be prevented by adjusting an eddy to compensate deterioration in a gradient magnetic field waveform. However, since the gradient magnetic field waveform needs to be overshot by 10% or more, the maximum gradient magnetic field of the MRI apparatus is not be available in some cases. In addition, it may take time to measure and adjust the eddy component with a short time constant in some cases.

To solve the problems as described above, in the MRI apparatus 100 according to the first embodiment, when imaging based on the FSE method is performed, the controller 26 executes a pulse sequence having spare time during the time after transient of the gradient magnetic field for dephasing, applied in the readout direction after the RF pulse for excitation is applied, until the first RF pulse for refocusing is applied. For example, when the imaging based on the FSE method is performed, the controller 26 executes a pulse sequence in which the time from the application of an RF pulse for excitation to the application of the first RF pulse for refocusing is extended to be longer than a half of the ETS by a predetermined extension time. Hereinafter, features of the MRI apparatus 100 will be described in detail.

Figure 3:
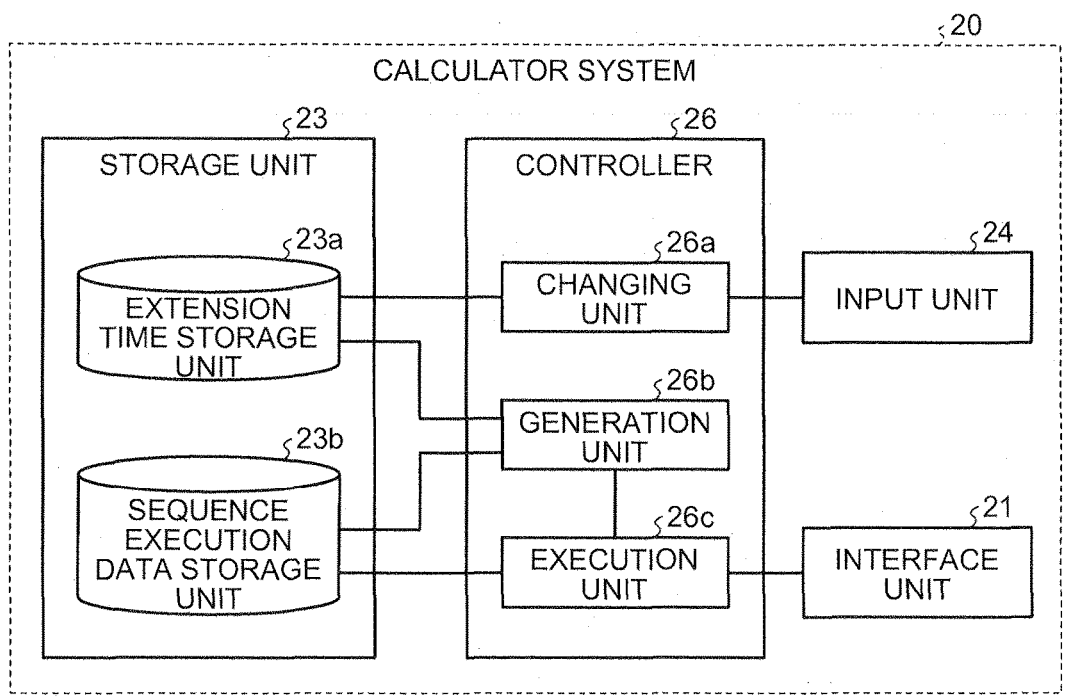
FIG. 3 is a functional block diagram illustrating a detailed configuration of the MRI apparatus according to the first embodiment.

FIG. 3 is a functional block diagram illustrating a detailed configuration of the MRI apparatus 100 according to the first embodiment. FIG. 3 illustrates the interface unit 21, the storage unit 23, and the controller 26 out of the components included in the calculator system 20 illustrated in FIG. 1.

As illustrated in FIG. 3, the storage unit 23 includes an extension time storage unit 23a and a sequence execution data storage unit 23b.

In the case where imaging based on the FSE method is performed, the extension time storage unit 23a stores therein, as extension time, spare time set during the time after transient of the gradient magnetic field for dephasing, applied in the readout direction after the pulse for excitation is applied, until the first refocusing pulse is applied. For example, the extension time stored in the extension time storage unit 23a is registered in advance by a system administrator or the like when the MRI apparatus 100 is installed. For example, the extension time is set to be from about several hundreds of µs to several tens of ms. More specifically, the extension time is set to be 1 ms, for example.

The extension time storage unit 23a is set with spare time obtained from a short time constant of the eddy field that cannot be sufficiently compensated by the hardware of the MRI apparatus 100. For example, the spare time is set on the basis of the time constant of the eddy field measured when the MRI apparatus 100 is installed or the time constant of the eddy field measured during pre-scanning. Specifically, for example, if the measured time constant of the eddy field is 200 μs, the spare time is set to be 600 μs, which is about three times the time constant of 200 μs.

The sequence execution data storage unit 23b stores therein sequence execution data generated by a generation unit 26b to be described later. As described above, the sequence execution data described herein means information that defines a pulse sequence indicating procedures to execute scanning of the subject, such as strength and a timing of the power supplied from the gradient power supply 3 to the gradient coil 2, strength and a timing of the RF signal transmitted from the transmitter 7 to the transmission RF coil 6, and a timing at which the receiver 9 detects the magnetic resonance signal.

When the imaging based on the spin echo-based imaging method is performed, the controller 26 executes a pulse sequence in which the time from application of the excitation pulse to application of the first refocusing pulse is extended by a predetermined extension time. In the first embodiment, when imaging based on the FSE method is performed, controller 26 executes a pulse sequence in which the time from application of an RF pulse for excitation to application of the first RF pulse for refocusing is extended to be longer than half of the ETS by a predetermined extension time. Specifically, the controller 26 includes a changing unit 26a, the generation unit 26b, and an execution unit 26c.

The changing unit 26a changes the predetermined extension time on the basis of an instruction from the operator. Specifically, the changing unit 26a receives an instruction to change the extension time from the operator through the input unit 24, and according to the received instruction changes the extension time stored in the extension time storage unit 23a. In this case, for example, the changing unit 26a receives the extension time designated by the operator using a graphical user interface (GUI) such as a text box or a slide bar displayed on the display unit 25.

When imaging based on the FSE method is performed, the generation unit 26b generates sequence execution data having spare time during the time after transient of the gradient magnetic field for dephasing, applied in the readout direction after the excitation pulse is applied, until the first refocusing pulse is applied. For example, when imaging based on the FSE method is performed, generation unit 26b generates sequence execution data in which the time from application of the excitation pulse to application of the first refocusing pulse is extended by a predetermined extension time. Specifically, when imaging based on the FSE method is performed, the generation unit 26b generates sequence execution data in which the time from application of the excitation pulse to application of the first refocusing pulse is extended to be longer than half of the ETS by the predetermined extension time stored in extension time storage unit 23a.

The generation unit 26b changes the predetermined extension time according to the instruction from the operator, and generates sequence execution data in which the time from the application of the excitation pulse to the application of the first refocusing pulse is extended by the changed extension time. Specifically, when the extension time is changed by the changing unit 26a, the generation unit 26b reads out the changed extension time from the extension time storage unit 23a. Then the generation unit 26b generates sequence execution data in which the time from the application of the excitation pulse to the application of the first refocusing pulse is extended by the extension time read out from the extension time storage unit 23a. Thereafter, the generation unit 26b causes the sequence execution data storage unit 23b to store therein the generated sequence execution data. Accordingly, the operator may optionally adjust the extension time, so that alleviation of uneven sensitivity or increase in fat signals due to J-Coupling can also be adjusted.

Figure 4:
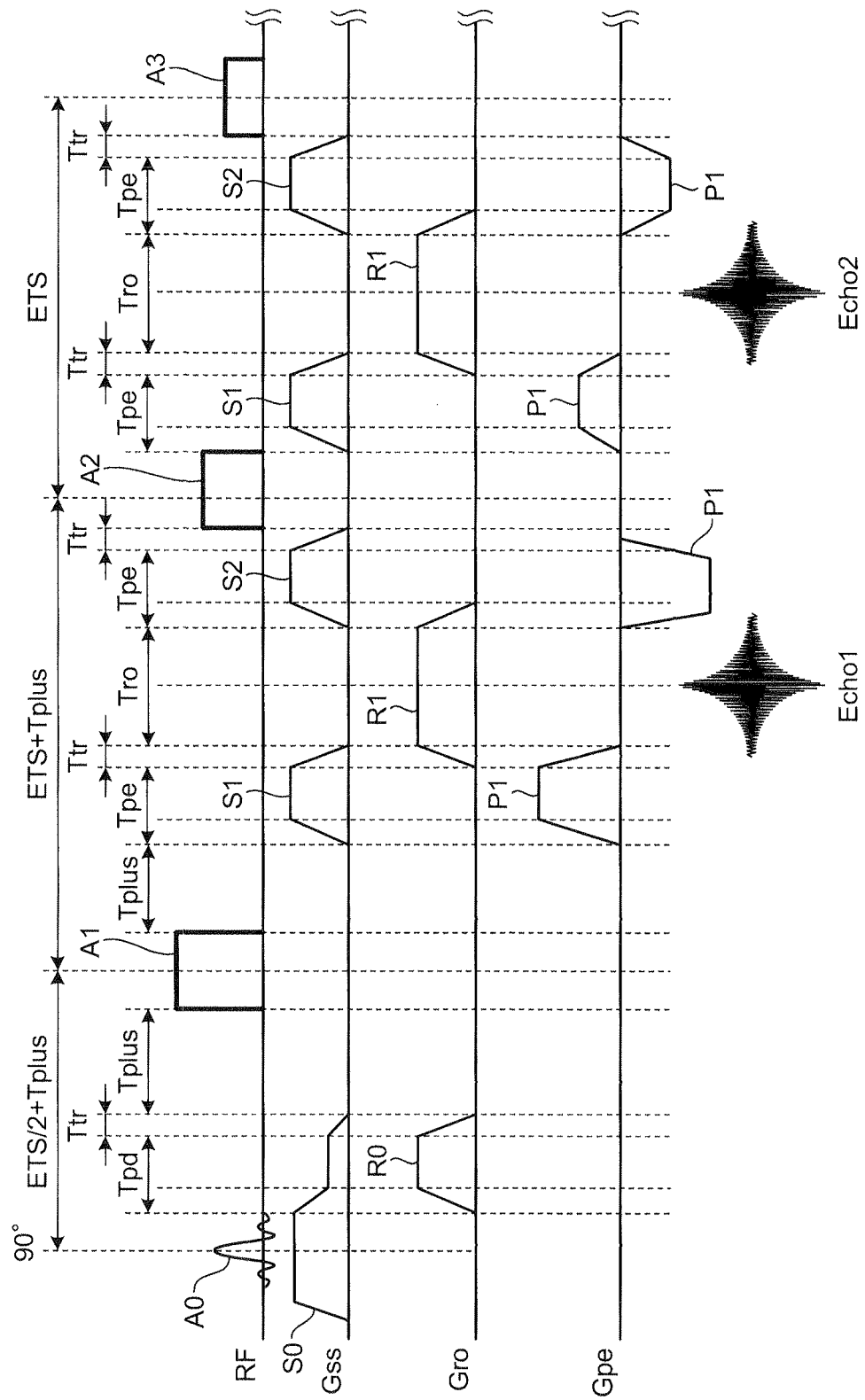
FIG. 4 is a chart illustrating an example of a pulse sequence of an FSE method according to the first embodiment.

FIG. 4 is a chart illustrating an example of the pulse sequence of the FSE method according to the first embodiment. The example illustrated in FIG. 4 is an example of a pulse sequence using the VFA method similarly to FIG. 2, and an example in the case where a slice selection in each of the refocusing pulses is non-selective. However, in this pulse sequence, the length of the section from the excitation pulse A0 to the first refocusing pulse A1 is extended as compared to that of FIG. 2.

Specifically, as illustrated in FIG. 4, the generation unit 26b extends the section from the excitation pulse A0 to the first refocusing pulse A1 by Tplus with respect to a half of the ETS. Tplus is an extension time stored in the extension time storage unit 23a. In this case, for example, as illustrated in FIG. 4, the generation unit 26b extends the time after transient of the gradient magnetic field for dephasing R0, applied in the readout direction after the RF pulse for excitation A0 is applied, by Tplus. For the second refocusing pulse A2 and the subsequent pulses, the refocusing pulses are applied at intervals of the ETS.

As described above, the time after transient of the gradient magnetic field for dephasing R0 is extended by the predetermined extension time Tplus to remove, within the extended time, the eddy component with short time constant of the eddy field generated by the gradient magnetic field for dephasing R0. As a result, an influence of the eddy component with a short time constant, which has not been sufficiently solved through adjustment of the area of the gradient magnetic field for dephasing R0, can be alleviated to suppress image quality deterioration in the readout direction.

The generation unit 26b may extend not only the time after transient of the gradient magnetic field for dephasing R0 but also application time (Tpd) of the gradient magnetic field for dephasing R0. In this case, for example, the generation unit 26b divides Tplus into two, and allocates one for extending the application time of the gradient magnetic field for dephasing R0 and the other for extending the time after transient of the gradient magnetic field for dephasing R0. As described above, amplitude (strength) of the gradient magnetic field for dephasing R0 can be reduced by extending the application time of the gradient magnetic field for dephasing R0; therefore the eddy field generated by the gradient magnetic field for dephasing R0 can be reduced. Accordingly, an influence of the eddy component with a short time constant included in the eddy field generated by the gradient magnetic field for dephasing R0 can be reduced.

In the example illustrated in FIG. 4, the generation unit 26b also extends the section from the first refocusing pulse A1 to the second refocusing pulse A2, by Tplus. In this case, for example, as illustrated in FIG. 4, the generation unit 26b extends the time from the application of the first refocusing pulse A1 to the application of the first gradient magnetic field for phase encoding P1, by Tplus. Alternatively, the generation unit 26b may extend the section of Ttr before Tro or the section of Tpe.

In the example illustrated in FIG. 4, the time from the application of the excitation pulse to the application of the first refocusing pulse is extended to be longer than a half of the ETS by the predetermined extension time. In this case, the echo signal may be influenced by nonuniformity of the static magnetic field. Therefore, for example, the generation unit 26b may adjust strength of the first gradient magnetic field for spoiler applied after the first refocusing pulse is applied or strength of the first gradient magnetic field for rewinding applied before the first refocusing pulse is applied.

Figure 5:
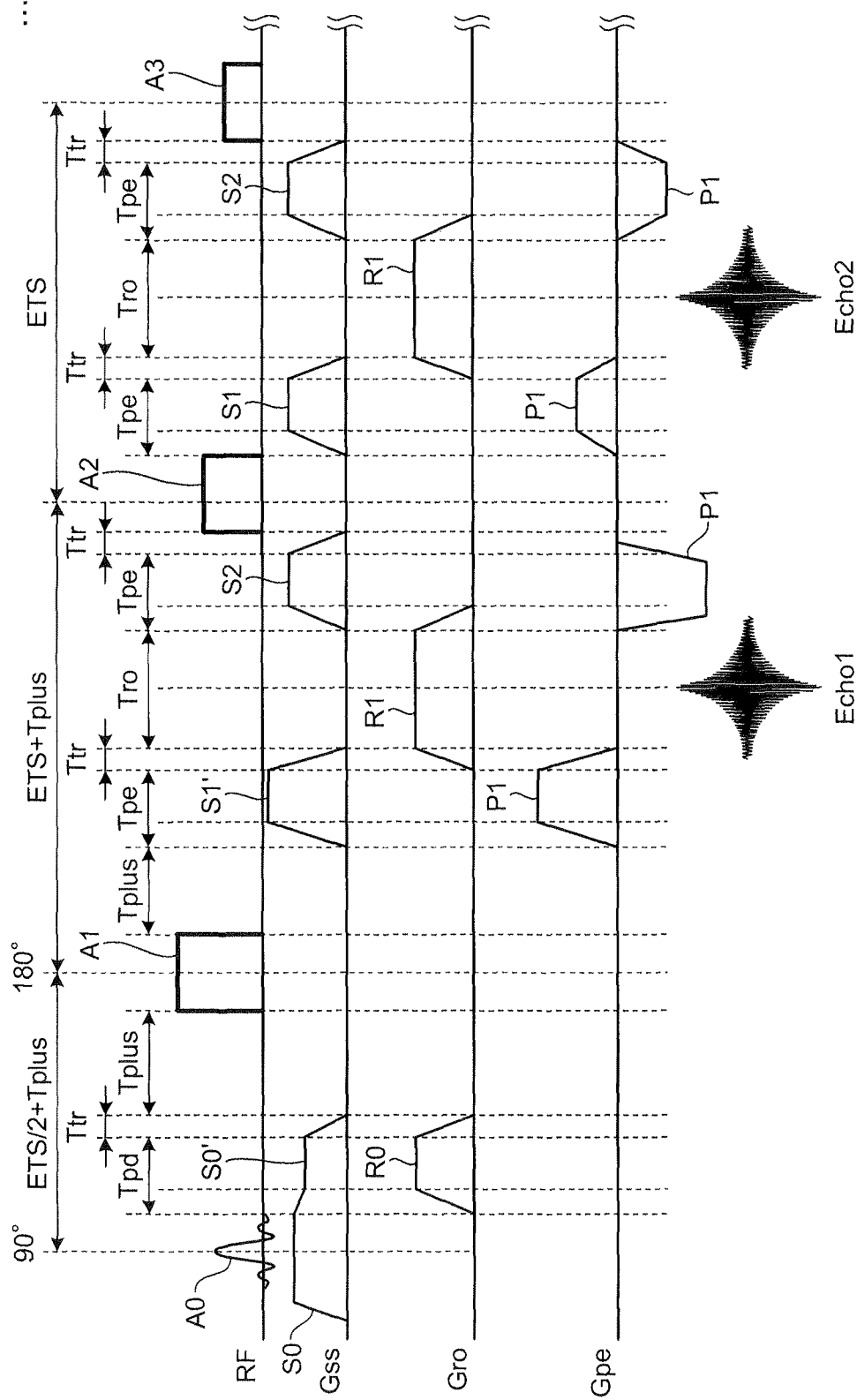
FIG. 5 is a chart illustrating a first modification of the pulse sequence of the FSE method according to the first embodiment.

FIG. 5 is a chart illustrating a first modification of the pulse sequence of the FSE method according to the first embodiment. As illustrated in FIG. 5, for example, the generation unit 26b generates a pulse sequence basically the same as the pulse sequence illustrated in FIG. 4. The difference is that, in the pulse sequence illustrated in FIG. 5, the first gradient magnetic field for spoiler S1' applied after the first refocusing pulse A1 is applied is stronger than the second and subsequent gradient magnetic fields for spoiler, and the first refocusing pulse A1 is 180° pulse. In this case, the generation unit 26b also strengthens the first gradient magnetic field for rewinding S' applied before the first refocusing pulse A0 is applied by the same amount as the gradient magnetic field for spoiler S1'. As a result, an influence of the nonuniformity of the static magnetic field with respect to the echo signal can be suppressed even when the time from the application of the excitation pulse to the application of the first refocusing pulse is extended to be longer than a half of the ETS.

In the example illustrated in FIG. 4, the time from the application of the excitation pulse to the application of the first refocusing pulse is extended to be longer than a half of the ETS by the predetermined extension time. However, the embodiment is not limited thereto. For example, the generation unit 26b may generate a pulse sequence in which the time from the excitation pulse to the first refocusing pulse is a half of the ETS as with the pulse sequence illustrated in FIG. 2.

Figure 6:
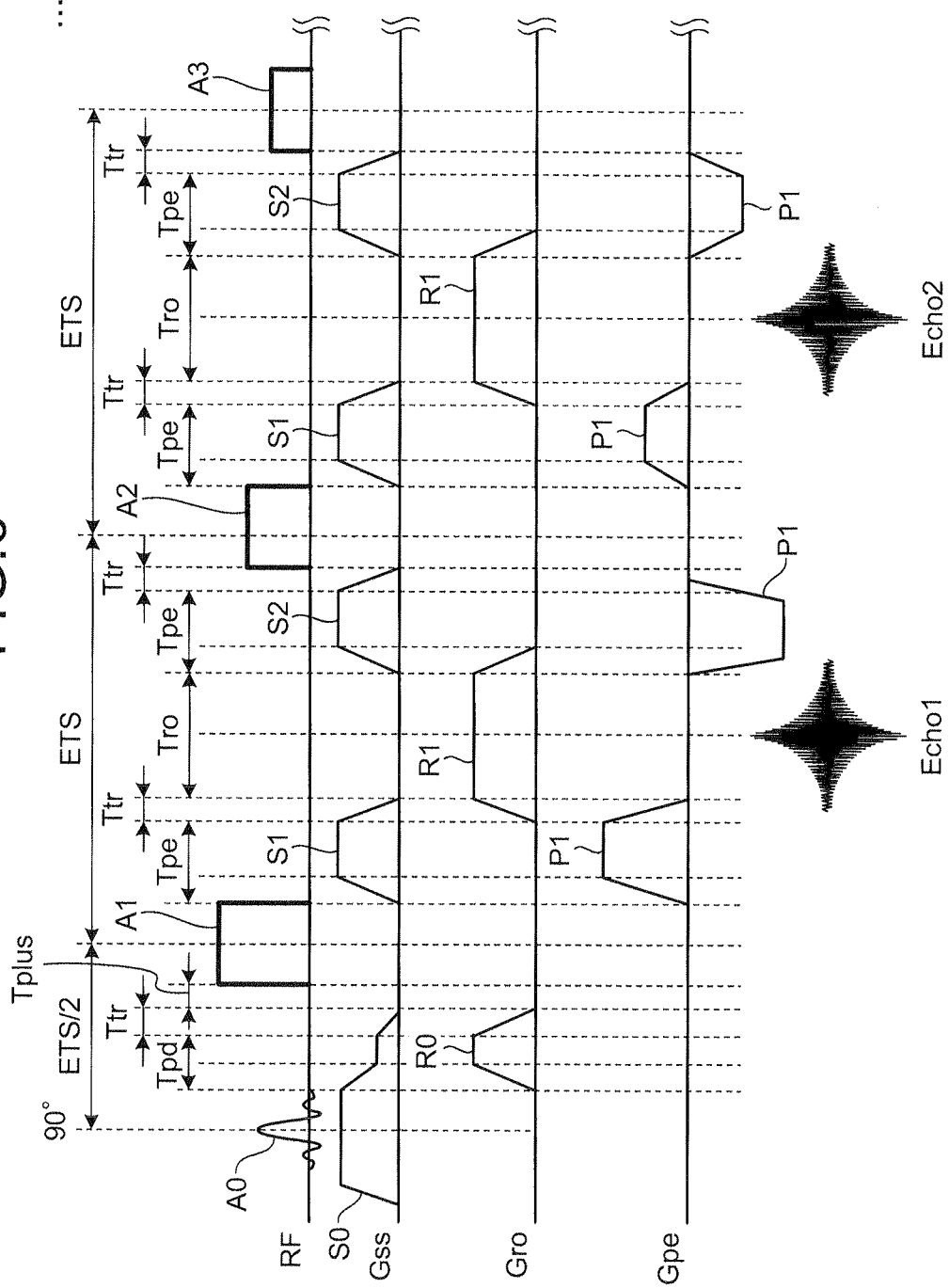
FIG. 6 is a chart illustrating a second modification of the pulse sequence of the FSE method according to the first embodiment.

FIG. 6 is a chart illustrating a second modification of the pulse sequence of the FSE method according to the first embodiment. The example illustrated in FIG. 6 is an example of a pulse sequence using the VFA method similarly to FIG. 2, and an example in the case where a slice selection in each of the refocusing pulses is non-selective. As illustrated in FIG. 6, for example, the generation unit 26b secures spare time Tplus during the time after transient of the gradient magnetic field for dephasing R0 until the refocusing pulse A1 is applied by shortening application time Tpd of the gradient magnetic field for dephasing R0 applied in the readout direction after the excitation pulse A0 is applied, while maintaining the time from the excitation pulse A0 to the first refocusing pulse A1 to be a half of the ETS in the pulse sequence illustrated in FIG. 2. Accordingly, the eddy component with a short time constant in the eddy field generated by the gradient magnetic field for dephasing R0 can be removed in the spare time Tplus.

The execution unit 26c executes the pulse sequence on the basis of the sequence execution data generated by the generation unit 26b. Specifically, when the sequence execution data is generated by the generation unit 26b, the execution unit 26c reads out the generated sequence execution data from the sequence execution data storage unit 23b. Then the execution unit 26c executes the pulse sequence defined by the sequence execution data by transmitting the generated sequence execution data to the sequence controller 10 via the interface unit 21.

Next, a flow of imaging by the MRI apparatus 100 according to the first embodiment will be described.

Figure 7:
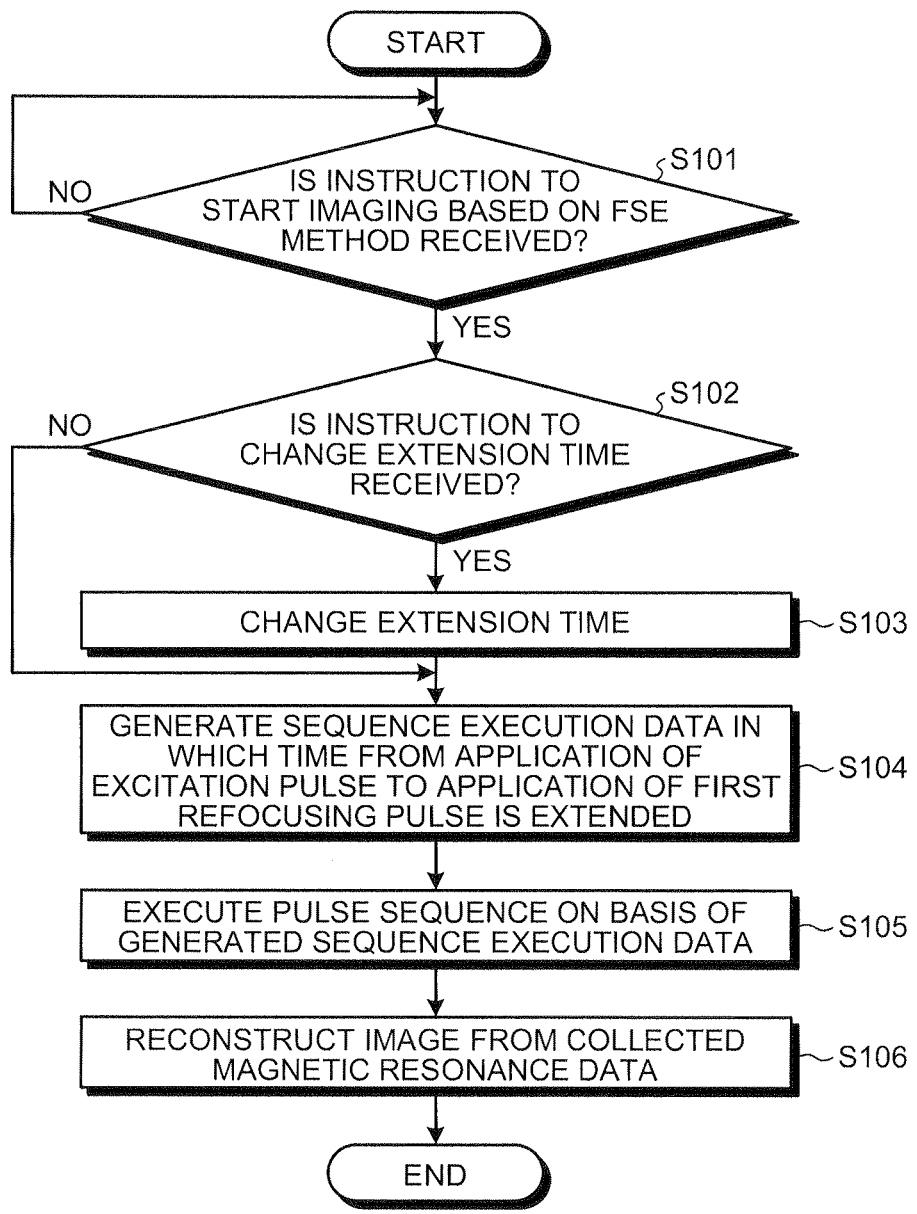
FIG. 7 is a flowchart illustrating a flow of imaging by the MRI apparatus according to the first embodiment.

FIG. 7 is a flowchart illustrating the flow of imaging by the MRI apparatus 100 according to the first embodiment. As illustrated in FIG. 7, the MRI apparatus 100 according to the first embodiment executes the procedures described below when the controller 26 receives an instruction to start imaging based on the FSE method from an operator (Yes at step S101).

First, the changing unit 26a receives an instruction to change the extension time from the operator (Yes at step S102), and changes the extension time stored in the extension time storage unit 23a according to the received instruction (step S103). If the changing unit 26a does not receive the instruction to change the extension time from the operator (No at step S102), the processing proceeds without changing the extension time stored in the extension time storage unit 23a.

Subsequently, the generation unit 26b generates sequence execution data in which the time from the application of the excitation pulse to the application of the first refocusing pulse is extended (step S104). In this case, the generation unit 26b executes a pulse sequence in which the time from the application of the excitation pulse to the application of the first RF pulse for refocusing is extended to be longer than a half of the ETS by the extension time stored in the extension time storage unit 23a.

Then the execution unit 26c executes the pulse sequence on the basis of the sequence execution data generated by the generation unit 26b (step S105). The image reconstruction unit 22 reconstructs the image from the magnetic resonance data collected by executing the pulse sequence by the execution unit 26c (step S106).

As described above, according to the first embodiment, when the imaging based on the FSE method is performed, the time from the application of the excitation pulse to the application of the first refocusing pulse is extended to be longer than a half of the ETS, so that the eddy component with a short time constant can be removed in the extended time. As a result, according to the first embodiment, an image without image quality deterioration such as uneven sensitivity due to the eddy component with a short time constant, ringing, or signal degradation can be obtained in the imaging based on the FSE method, even when the ETS is shortened.

Figure 8:
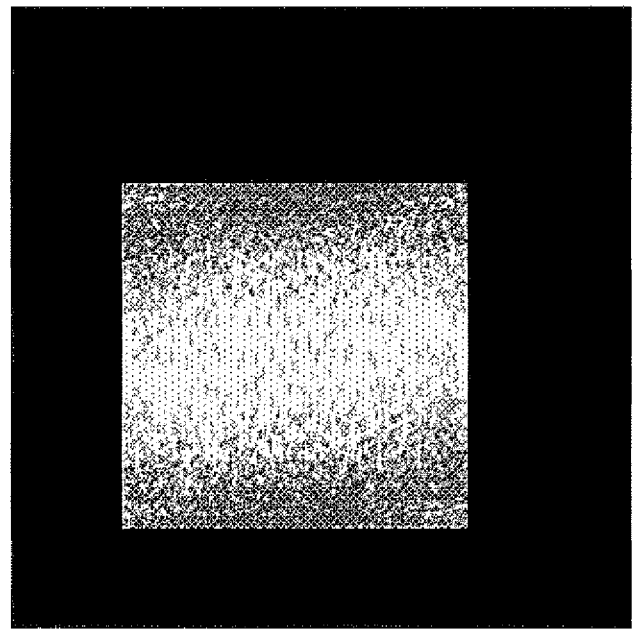
FIG. 8 is a diagram illustrating a phantom image imaged by the FSE method in the related art.
Figure 9:
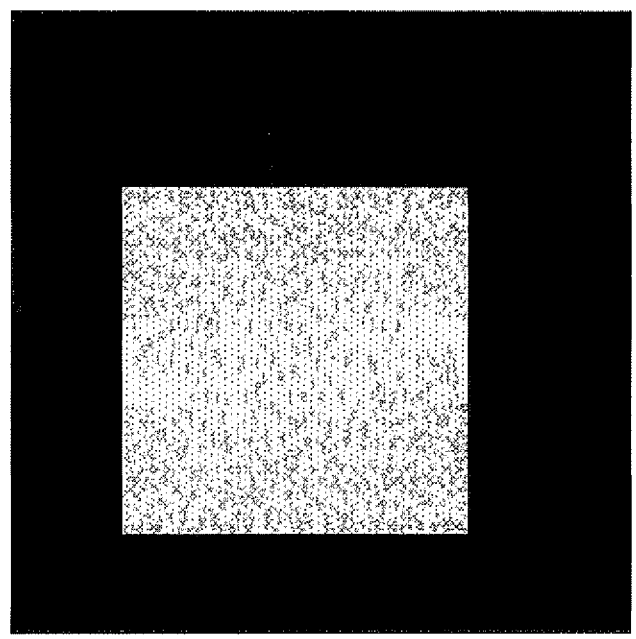
FIG. 9 is a diagram illustrating a phantom image imaged by the FSE method according to the first embodiment.

FIG. 8 is a diagram illustrating a phantom image imaged by the FSE method in the related art. FIG. 9 is a diagram illustrating a phantom image imaged by the FSE method according to the first embodiment. In FIGS. 8 and 9, the vertical direction represents the readout direction. As illustrated in FIG. 8, signal degradation occurs at the end, in the readout direction, of a phantom image imaged by the FSE method in the related art. In contrast, as illustrated in FIG. 9, signal degradation at the end, in the readout direction, of a phantom image imaged by the FSE method according to the first embodiment is suppressed.

Second Embodiment

In the above-described embodiment, the example in the case where a slice selection in each of the refocusing pulses is non-selective in the pulse sequence of the FSE method is described; however, the embodiment is not limited thereto. For example, the technique described in the above-described embodiment can also be applied in the case where a slice selection in each of the refocusing pulses is performed in the pulse sequence of the FSE method. Such a case will be described as a second embodiment hereinbelow. Although the MRI apparatus according to the second embodiment is basically the same as that illustrated in FIGS. 1 and 3, the pulse sequence generated by the generation unit 26b is different.

Figure 10:
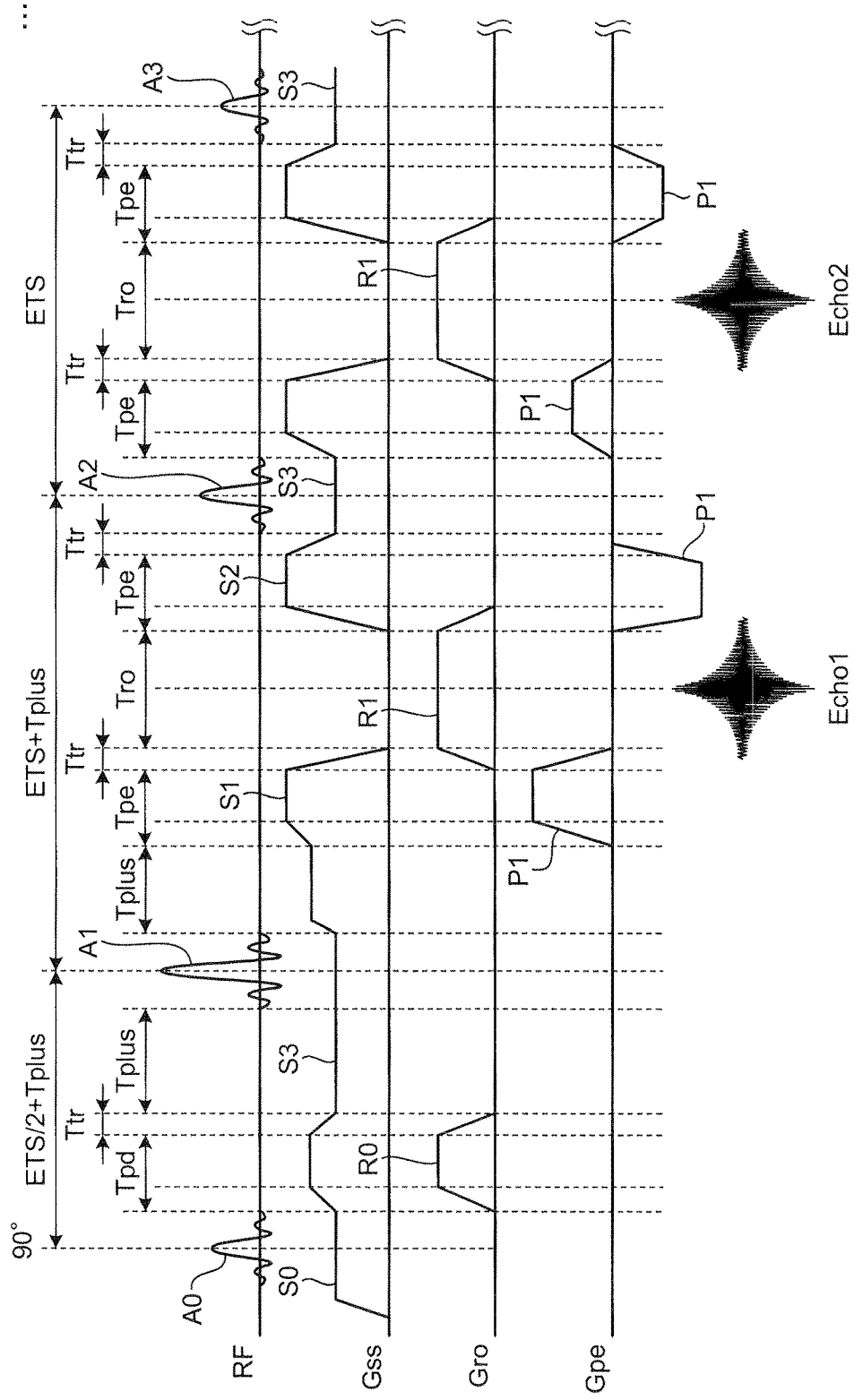
FIG. 10 is a chart illustrating an example of a pulse sequence of an FSE method according to a second embodiment.

FIG. 10 is a chart illustrating an example of a pulse sequence of an FSE method according to a second embodiment. The example illustrated in FIG. 10 is a pulse sequence using the VFA method similarly to FIG. 2. However, it is different from the pulse sequence in FIG. 2 in that the slice selection is performed in each of the refocusing pulses. Specifically, in the example illustrated in FIG. 10, the slice selection is performed by applying a gradient magnetic field for slice selection S3 when the refocusing pulses are applied.

In the second embodiment, the generation unit 26b extends the section from the excitation pulse A0 to the first refocusing pulse A1 by Tplus with respect to a half of the ETS when the imaging based on the FSE method is performed using the pulse sequence as described above. Tplus is an extension time stored in the extension time storage unit 23a. In this case, for example, as illustrated in FIG. 10, the generation unit 26b extends the time after transient of the gradient magnetic field for dephasing R0, applied in the readout direction after the RF pulse for excitation A0 is applied, by Tplus. Also in the case illustrated in FIG. 10, the refocusing pulses are applied at intervals of the ETS for the second refocusing pulse A2 and the subsequent pulses.

As described above, also in the second embodiment, the time after transient of the gradient magnetic field for dephasing R0 is extended by the predetermined extension time Tplus, so that the component of the short eddy field can be removed in the extended time. As a result, an influence of the eddy component with a short time constant included in the eddy field generated by the gradient magnetic field for dephasing R0 can be alleviated, so that image quality deterioration in the readout direction can be suppressed.

As illustrated in FIG. 10, in the case where the slice selection is performed in each of the refocusing pulses, the generation unit 26b may accelerate the timing of raising the magnetic field with respect to the gradient magnetic field for slice selection applied for the first refocusing pulse A1. For example, the generation unit 26b may start the application immediately after the gradient magnetic field for slice selection applied for the excitation pulse A0 or immediately before the refocusing pulse A1.

Also in the second embodiment, the generation unit 26b may extend not only the time from the application of the excitation pulse A0 to the application of the first refocusing pulse A1 but also the application time of the gradient magnetic field for dephasing R0. In this case, for example, the generation unit 26b allocates part of the time Tplus for extending the application time of the gradient magnetic field for dephasing R0 and the remainder for extending the section from the first refocusing pulse A1 to the second refocusing pulse A2. As described above, amplitude (strength) of the gradient magnetic field for dephasing R0 can be reduced by extending the application time of the gradient magnetic field for dephasing R0; therefore the eddy field generated by the gradient magnetic field for dephasing R0 can be reduced similarly to the first embodiment. Accordingly, also in the second embodiment, an influence of the eddy component with a short time constant included in the eddy field generated by the gradient magnetic field for dephasing R0 can be reduced.

In the example illustrated in FIG. 10, similarly to the first embodiment, the generation unit 26b also extends the section from the first refocusing pulse A1 to the second refocusing pulse A2 by Tplus. In this case, for example, as illustrated in FIG. 10, the generation unit 26b extends the time from the application of the first refocusing pulse A1 to the application of the gradient magnetic field for phase encoding by Tplus. Alternatively, the generation unit 26b may extend the section of Ttr before Tro or the section of Tpe.

In the above-described embodiment, the example using the VFA method is described; however, the embodiment is not limited thereto. For example, the technique described in the above-described embodiment can also be applied to a constant flip angle (CFA) method for collecting a plurality of echo signals while making the flip angle of the refocusing pulse constant in the pulse sequence of the FSE method.

Third Embodiment

In the above-described embodiment, the example in the case where the imaging is performed based on the FSE method is described; however, the embodiment is not limited thereto. For example, the technique described in the above-described embodiment can also be applied in the case where the imaging is performed based on a spin echo (SE) method. Such a case will be described as a third embodiment hereinbelow. Although the MRI apparatus according to the third embodiment is basically the same as that illustrated in FIGS. 1 and 3, the pulse sequence generated by the generation unit 26b is different.

FIG. 11 is a chart illustrating an example of a pulse sequence of an SE method according to the third embodiment. As illustrated in FIG. 11, in the SE method, the refocusing pulse A1 is applied when TE (echo time)/2 has elapsed from the application of the excitation pulse A0 (90° pulse). As a result, an echo signal Echo1 is generated from the subject when has elapsed from the application of the excitation pulse A0.

For example, in the slice selection direction, the gradient magnetic field for slice selection S0 is applied when the excitation pulse A0 is applied, and the gradient magnetic field for slice selection S3 is applied when the refocusing pulse A1 is applied. For example, in the readout direction, the gradient magnetic field for dephasing R0 is applied after the gradient magnetic field for slice selection S0 of the excitation pulse A0 is applied, and subsequently, the gradient magnetic field for readout R1 is applied at the timing when the echo signal Echo1 is generated. For example, in the phase encoding direction, the gradient magnetic field for phase encoding P1 is applied after the gradient magnetic field for slice selection S0 of the excitation pulse A0 is applied.

In the SE method, one echo signal Echo01 is collected by executing the sequence from the application of the excitation pulse A0 to the application of the gradient magnetic field for readout R1 as described above. In addition, in the SE method, a plurality of echo signals with different phase encoding amounts are collected by repeatedly collecting such echo signals at TR intervals while changing the strength of the gradient magnetic field for phase encoding.

In the third embodiment, when the imaging based on the SE method is performed, the generation unit 26b generates a pulse sequence having spare time during the time after transient of the gradient magnetic field for phase encoding P1 applied after the excitation pulse A0 is applied until the first refocusing pulse A1 is applied. For example, in the case where the imaging based on the SE method is performed by using the pulse sequence, the generation unit 26b extends the time after transient of the gradient magnetic field for phase encoding P1 applied after the excitation pulse A0 is applied by Tplus. Tplus is an extension time stored in the extension time storage unit 23a. The generation unit 26b also executes the sequence in which the time after transient of the gradient magnetic field for phase encoding P1 applied after the excitation pulse A0 is applied by the predetermined extension time Tplus, for second and subsequent data collection.

As described above, in the third embodiment, the time after transient of the gradient magnetic field for phase encoding P1 is extended by the predetermined extension time Tplus, so that the component with a short time constant in the eddy field generated by the gradient magnetic field for phase encoding P1 can be removed in the extended time. As a result, an influence of the eddy component with a short time constant generated in the phase encoding direction can be alleviated, so that image quality deterioration in the phase encoding direction can be suppressed.

According to the embodiments described above, the image quality deterioration due to the eddy component with a short time constant included in the eddy field can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus comprising:
   a controller configured to execute a fast spin echo (FSE) MRI pulse sequence including an excitation radio frequency (RF) pulse followed by a sequence of plural refocusing RF pulses which produce a respectively corresponding plurality of MRI spin echo signal responses, said MRI pulse sequence having spare time in which no gradient magnetic field is applied and in which an influence of an eddy component with a short time constant is reduced during the time after transient of a gradient magnetic field for dephasing, applied in the readout direction after the RF excitation pulse is applied, until the first of said plural refocusing RF pulses is applied; and
   an image reconstruction unit configured to reconstruct an image, at least in part, from said plurality of MRI spin echo signal responses collected while executing the MRI pulse sequence.

2. The magnetic resonance imaging apparatus according to claim 1, wherein time from application of the excitation RF pulse to application of the first refocusing RF pulse is longer than half of an echo space in the MRI pulse sequence.

3. The magnetic resonance imaging apparatus according to claim 2, wherein a gradient magnetic field for spoiling is applied after each of said plurality of refocusing RF pulses is applied in the MRI pulse sequence, a first gradient magnetic field for spoiling applied after the first refocusing RF pulse is applied is stronger than second and subsequent gradient magnetic fields for spoiling, and the first refocusing RF pulse is a 180° pulse.

4. The magnetic resonance imaging apparatus according to claim 1, wherein the controller is further configured to change the spare time according to an instruction from an operator.

5. The magnetic resonance imaging apparatus according to claim 2, wherein the controller is further configured to change the spare time according to an instruction from an operator.

6. The magnetic resonance imaging apparatus according to claim 3, wherein the controller is further configured to change the spare time according to an instruction from an operator.

7. A magnetic resonance imaging apparatus comprising:
   a controller configured to execute a pulse sequence having spare time in which no gradient magnetic field is applied and in which an influence of an eddy component with a short time constant is reduced during the time after transient of a gradient magnetic field for phase encoding applied after a radio frequency (RF) pulse for excitation is applied until a first RF pulse for refocusing is applied when performing imaging based on a spin echo method; and
   an image reconstruction unit configured to reconstruct an image from magnetic resonance data collected by executing the pulse sequence.

8. The magnetic resonance imaging apparatus according to claim 7, wherein the controller is further configured to change the spare time according to an instruction from an operator.

9. A magnetic resonance imaging (MRI) apparatus comprising:
   a controller configured to execute a spin echo (SE) based MRI pulse sequence including an excitation radio frequency (RF) pulse followed by at least one refocusing RF pulse which produces at least one MRI spin echo signal response, said MRI pulse sequence having spare time in which no gradient magnetic field is applied and in which an influence of an eddy component with a short time constant is reduced during the time after transient of a gradient magnetic field for dephasing until the first of said at least one RF refocusing pulse is applied, wherein the spare time is obtained from a short time constant of an eddy field that cannot be sufficiently compensated by hardware of the apparatus; and
   an image reconstruction unit configured to reconstruct an image, at least in part, from said at least one MRI spin echo signal response collected while executing the MRI pulse sequence.

* * * * *